United States Patent
Balachandran et al.

(10) Patent No.: US 6,191,075 B1
(45) Date of Patent: Feb. 20, 2001

(54) METHOD OF MANUFACTURING A HIGH TEMPERATURE SUPERCONDUCTOR WITH IMPROVED TRANSPORT PROPERTIES

(75) Inventors: Uthamalingam Balachandran; Richard W. Siegel, both of Hinsdale, IL (US); Thomas R. Askew, Kalamazoo, MI (US)

(73) Assignee: University of Chicago, Chicago, IL (US)

( * ) Notice: Under 35 U.S.C. 154(b), the term of this patent shall be extended for 0 days.

(21) Appl. No.: 08/171,904

(22) Filed: Dec. 21, 1993

(51) Int. Cl.$^7$ ................................................. H01L 39/24
(52) U.S. Cl. ..................... 505/490; 264/614; 505/491; 505/500
(58) Field of Search ..................... 264/56, 614; 505/725, 505/739, 780, 781, 1, 490, 491, 500; 501/152

(56) References Cited

U.S. PATENT DOCUMENTS

| | | | |
|---|---|---|---|
| 4,999,338 | * | 3/1991 | Wijeyesekera et al. ............... 505/1 |
| 5,063,201 | * | 11/1991 | Rao et al. ............................... 505/1 |
| 5,202,307 | * | 4/1993 | Hayashi .................................. 505/1 |
| 5,262,398 | * | 11/1993 | Nagata et al. ......................... 505/1 |
| 5,284,823 | * | 2/1994 | Chou et al. ............................ 505/1 |

OTHER PUBLICATIONS

"Magnetic Flux Exclusion Properties of Ferromagnetic/Superconductive Powder Composites," R.B. Flippen, Solid State Communications, vol. 81, No. 1, pp. 105–107 (1992).

* cited by examiner

Primary Examiner—Christopher A. Fiorilla
(74) Attorney, Agent, or Firm—Michael D. Rechtin; Foley & Lardner

(57) ABSTRACT

A method of preparing a high temperature superconductor. A method of preparing a superconductor includes providing a powdered high temperature superconductor and a nanophase paramagnetic material. These components are combined to form a solid compacted mass with the paramagnetic material disposed on the grain boundaries of the polycrystaline high temperature superconductor.

7 Claims, 2 Drawing Sheets

METHOD OF MANUFACTURING A HIGH TEMPERATURE SUPERCONDUCTOR WITH IMPROVED TRANSPORT PROPERTIES

The United States Government has rights in this invention pursuant to Contract No. W-31-109-ENG-38 between the U.S. Department of Energy and The University of Chicago, representing Argonne National Laboratory.

The present invention is concerned generally with an article of manufacture and a method of manufacturing high temperature superconductors having improved transport properties. More particularly, the invention is concerned with an article and method of manufacture of high temperature superconductors having improved transport critical current density, or intergrain $J_c$.

Development of useful high temperature superconductors has been difficult since the discovery of such superconductors. In order to be commercially useful, it is important to improve the transport critical current density of these superconductors. Grain boundaries in polycrystalline forms of these superconductors act as weak links, and thus the grain boundaries can drastically diminish current transport across the boundaries which degrades transport properties.

OBJECTS OF THE INVENTION

It is therefore an object of the invention to provide an improved form of high temperature superconductor.

It is another object of the invention to provide a novel article and method of manufacture of high temperature superconductor with improved transport properties.

It is a further object of the invention to provide an improved article and method of manufacture of a high temperature superconductor with improved intergrain critical current density properties.

It is still another object of the invention to provide a novel article and method of manufacture of a high temperature superconductor having nanophase paramagnetic particles disposed in the grain boundaries to diminish weak transport links.

These objects and other advantages and features of the invention will be readily apparent from the following description of the preferred embodiments, taken in conjunction with the accompanying drawings described hereinbelow.

DETAILED DESCRIPTION OF PREFERRED EMBODIMENTS

The intergrain critical current density, $J_c$, in a high temperature superconductor (hereinafter, "HTSC") can be improved by addition of ultrafine grained phases, such as nanophase paramagnetic particles and most preferably superparamagnetic particles (herein "paramagnetic" shall include both paramagnetic and superparamagnetic particles). Normally, application of a magnetic field causes drastic diminution of $J_c$ which is usually quite large within each HTSC grain. In order to overcome the weak links created by grain boundaries in a polycrystalline HTSC, small size paramagnetic particles can be disposed on the grain boundaries to channel the magnetic flux thereby enabling improved current flow at selected locations along the grain boundary.

While not limiting the invention, it is believed that use of ultrafine grained (such as nanophase size particles) paramagnetic particles cause concentration of applied magnetic field lines in the vicinity of the paramagnetic particles and leads to reduced magnetic field strength elsewhere along the HTSC grain boundaries. Consequently, enhanced currents can be transported in those areas along the grain boundaries having lesser magnetic field density.

Figure 1:
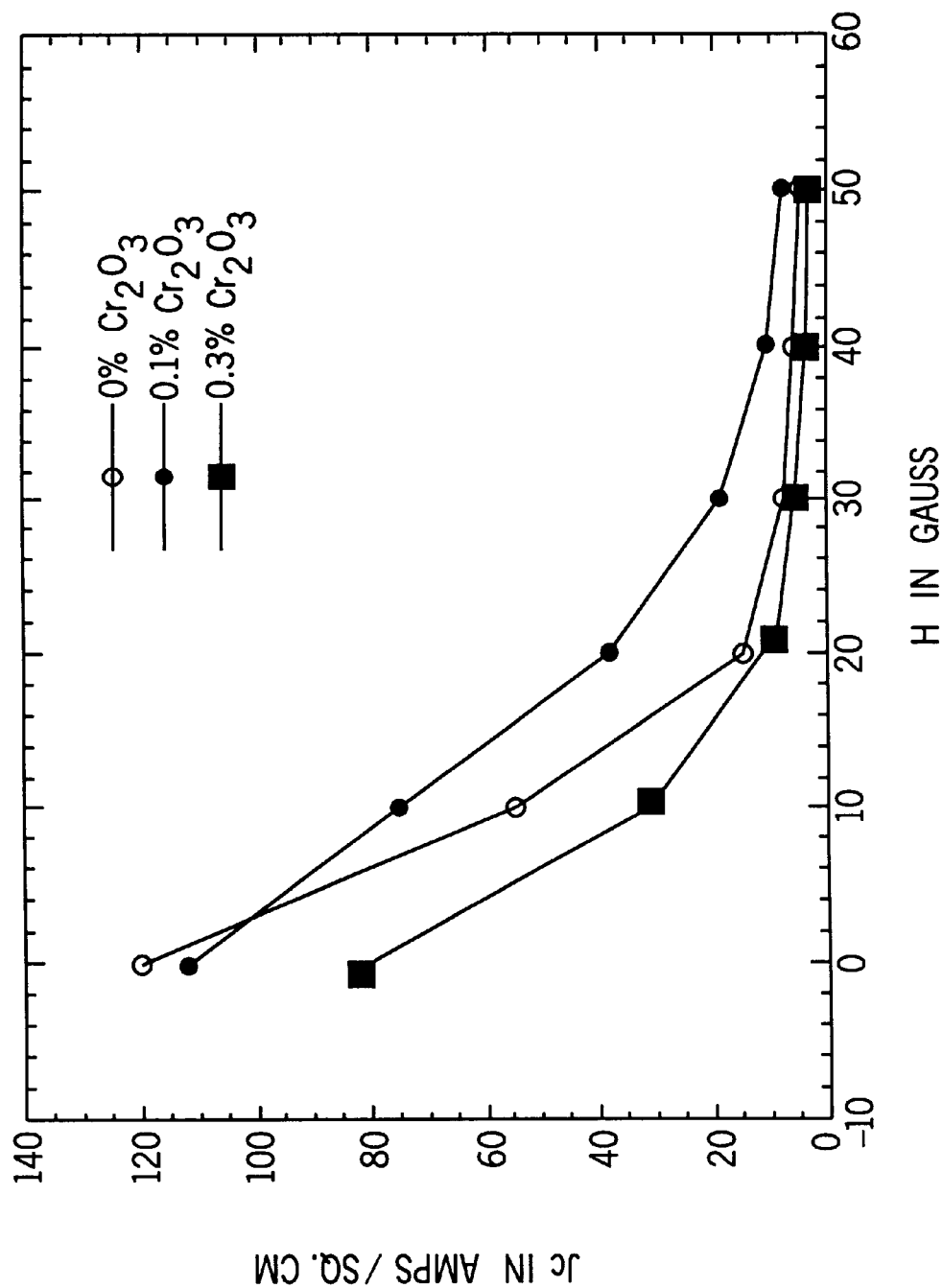
FIG. 1 illustrates critical current density versus magnetic field for YBCO superconductor with nanophase $Cr_2O_3$ added thereto.

As shown in FIG. 1, various amounts of nanophase $Cr_2O_3$ particles were added to conventional superconducting stoichiometries of 123 YBaCu oxide. The method used to manufacture the nanophase particles is described in U.S. Pat. No. 5,128,081 which is incorporated by reference herein. The most preferred size of $Cr_2O_3$ particles was determined to be about 10–500 Å in diameter. As can further be noted in FIG. 1, the amount of ultra-fine grained $Cr_2O_3$ has an optimum effect between 0 and 0.3% $Cr_2O_3$ for the 123 YBaCu oxide system. It is believed that too many $Cr_2O_3$ particles can result in too many paramagnetic centers which does not effectively concentrate the magnetic flux. This arrangement can thus have substantially the same effect as having no paramagnetic centers at all. However, there is clearly a beneficial effect with 0.1% $Cr_2O_3$ with substantially improved $J_c$ over the range of at least 10–50 gauss field. This same beneficial result can be observed in FIG. 2 wherein the ratio of $J_c(H)/J_c(H=0)$ is plotted for 123 YBaCu oxide polycrystalline specimens with and without the nanophase $Cr_2O_3$ additions (about 0.1% by weight).

In other forms of the invention, various paramagnetic materials (such as iron oxides) can be made in a nanophase size range, added to the HTSC material and the $J_c$ increased by minimizing the effect of the magnetic field on intergrain transport properties. In other embodiments using other HTSC materials, such as BSCCO, the HTSC material can likewise be combined with a paramagnetic particle dispersion in the manner described herein. Such systems can use the basic concept of the microscopic concentration of magnetic fields by such paramagnetic particles dispersed along grain boundaries of the HTSC material. The following nonlimiting example illustrates various details of a preferred method of the invention.

EXAMPLE

YBCO (123) powders can be prepared generally in accordance with the methods set forth in U.S. Pat. No. 5,086,034 which is incorporated by reference herein. In a preferred method, 121.78 grams of powdered $Y_2O_3$, 422.92 grams of powdered $BaCO_3$, and 255.32 grams of powdered CuO were mixed together and wet milled for ≈15 hours in methanol in polyethylene jars containing $ZrO_2$ grinding media. The resultant slurry was pan dried and screened through a 30 mesh sieve. The screened powder was placed in dense alumina pans and inserted into a long tube furnace. A vacuum was established in the furnace of about 2.66 Pa (0.02 mm Hg), and oxygen gas was introduced into the furnace and adjusted to about 266 Pa (2 mm Hg) at a flow rate of about 2 liters/minute. The furnace temperature was increased at a rate of ≈100° C./hour to ≈625° C. when $CO_2$ evolution began. At 625° C. the heating rate was reduced to ≈20° C./hour to maintain the $CO_2$ level to no greater than 2.66 Pa (0.02 mm Hg). Heating was continued to 800° C.

The temperature and pressure were held at 800° C. for about four hours until $CO_2$ evolution ceased and formation of the ceramic was complete. The material was then cooled to about 600° C., the vacuum was discontinued and the oxygen pressure increased to $1 \times 10^5$ Pa (760 mm Hg, atmospheric pressure). Cooling was continued to 450° C. and that temperature was held for about 10 hours. After cooling to room temperature, the powder was crushed in a mechanical grinder, and the particle size was ≈5 microns. The powder was then characterized by XRD and DTA (Differential Thermal Analysis) and determined to be YBCO (123).

The mixing of YBCO and $Cr_2O_3$ (nanophase material) was performed as follows: About 0.187 grams of nanophase $Cr_2O_3$ was placed in a clean beaker and ≈200 ml of methanol was added and mixed with the components in an ultrasonic mixer device (with a microtip) for ≈5 minutes. We then added 35.534 gams of YBCO Powders (prepared as above) and again mixed in the ultrasonic mixer for ≈5 minutes. The mixed slurry was dried on a hot plate in a Pyrex tray. The dried paste was again dried in an oven maintained at ≈150° C. overnight. The overnight dried powder was crushed in a mortar and pestle. Pellets (≈0.5 inch diameter) were pressed from this powder. For control experiments YBCO powders without any $Cr_2O_3$ were also pressed. These pressed pellets were sintered in oxygen at ambient pressure at 950° C. for 10 hours. During cooling they were held at ≈450° C. for 60 hours for oxygenation and then cooled to room temperature.

Figure 2:
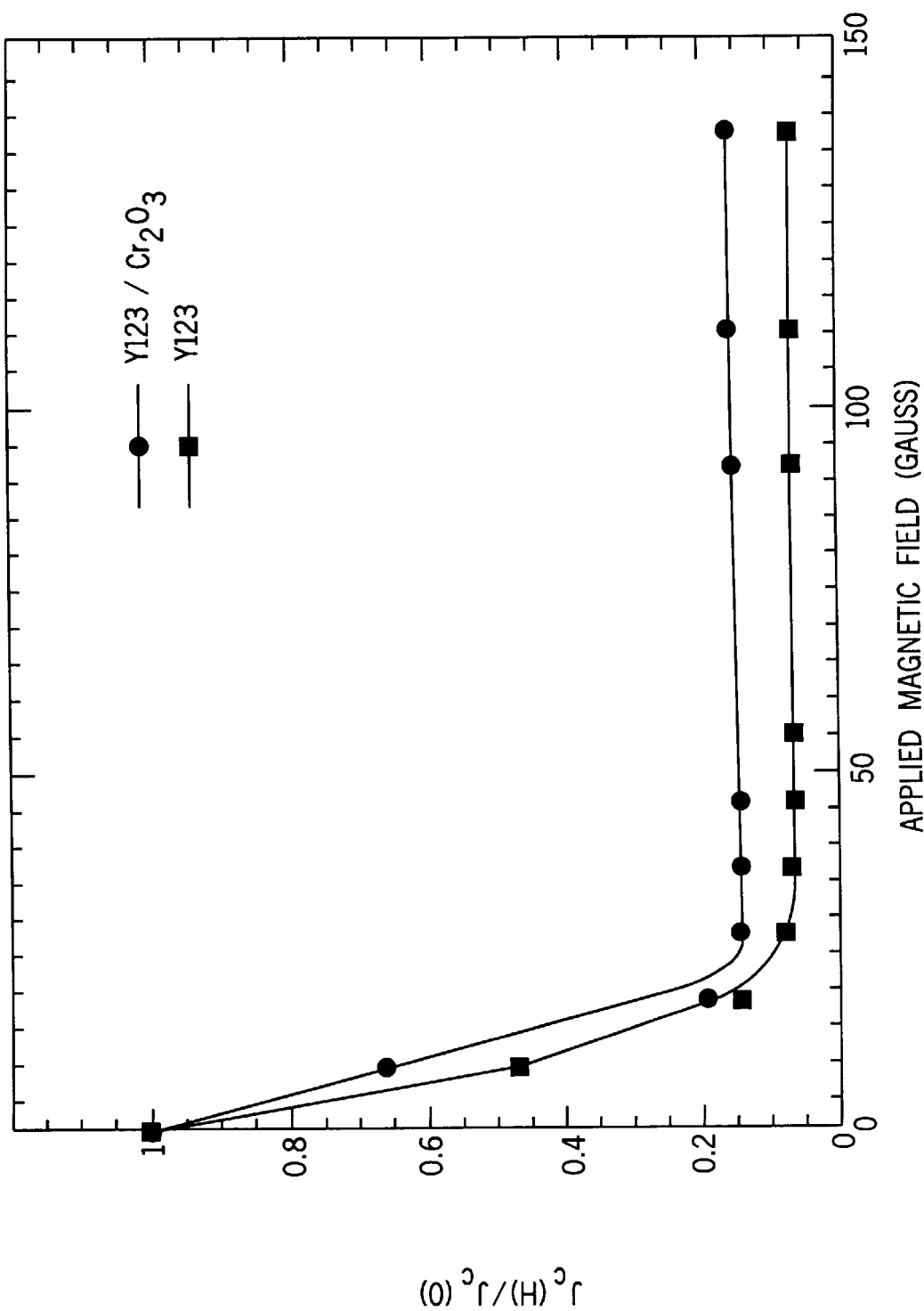
FIG. 2 illustrates a ratio of critical current density with an applied magnetic field to critical current density without a field for a YBCO (123) and a YBCO (123) with added $Cr_2O_3$ particles (in weight percent).

Thin specimen slices were cut from the sintered pellets using a slow speed diamond saw. Four probe DC measurements were made to determine the $J_c$ values in zero and applied external fields. FIG. 1 shows the $J_c$ vs. field for YBCO with 0%, 0.1%, and 0.3% (weight) $Cr_2O_3$. FIG. 2 shows the $J_c$ (in field)/$J_c$ (zero field) vs applied field for a YBCO+0.1 wt. % $Cr_2O_3$ sample.

The above embodiments illustrate various forms of the invention but variations and modifications of these embodiments are encompassed within the scope of the following claims.

What is claimed is:

1. A method of preparing a high temperature superconducting material, comprising the steps of:
   (a) providing a powdered high temperature superconductor having particles of micron size range;
   (b) providing ultra-fine grained superparamagnetic particles having diameters of from about 10 to 500 Angstroms, and having a localized magnetic susceptibility behavior arising from their size being in the range of about 10 to 500 Angstroms in diameter; and
   (c) combining said ultra-fine grained superparamagnetic particles with said powdered high temperature superconductor to form a solid mass comprised of crystalline grains of said superparamagnetic particles and said powdered high temperature superconductor, said superparamagnetic particles constituting about 0.1–0.3% by weight of the total, and having grain boundaries between said grains of said powdered high temperature superconductor and a dispersion of said superparamagnetic particles on the grain boundaries, thereby enhancing intergrain critical current density of said high temperature superconducting material.

2. The method as defined in claim 1 wherein said step (c) further comprises forming a compacted solid mass of said high temperature superconductor and said super paramagnetic particles.

3. The method as defined in claim 1 wherein said high temperature superconductor material consists essentially of $Y Ba_2 Cu_3 O_7$ and a super paramagnetic material.

4. The method as defined in claim 3 wherein said super paramagnetic material consist of essentially of a transition metal oxide.

5. A method of preparing a high temperature 123 YBaCu oxide superconductor, comprising the steps of:
   (a) providing powdered 123 YBaCu oxide superconductor of micron size range;
   (b) providing a nanophase size powder of superparamagnetic material;
   (c) combining said powdered 123 YBaCu oxide superconductor and said powder of superparamagnetic material with said superparamagnetic material about 0.1–0.3% by weight of the total; and
   (d) thermally treating said combined mixture of 123 YBaCu oxide superconductor and superparamagnetic material to form a solid mass having said superparamagnetic material disposed on grain boundaries of said 123 YBaCu oxide superconductor, the nanophase size of the superparamagnetic powder causing concentration of applied magnetic field lines near the superparamagnetic particles and thereby reducing magnetic field strength away from the superparamagnetic particles.

6. The method as defined in claim 5 wherein said step (d) comprises sintering said combined mixture.

7. The method as defined in claim 5 wherein said step (d) comprises firing said combined mixture.

* * * * *